(12) United States Patent
Poullet

(10) Patent No.: US 6,636,434 B2
(45) Date of Patent: Oct. 21, 2003

(54) MULTIBIT MEMORY POINT MEMORY

(75) Inventor: Frédéric Poullet, Vizille (FR)

(73) Assignee: Dolphin Integration, Meylan (FR)

( * ) Notice: Subject to any disclaimer, the term of this patent is extended or adjusted under 35 U.S.C. 154(b) by 0 days.

(21) Appl. No.: 10/171,607

(22) Filed: Jun. 14, 2002

(65) Prior Publication Data

US 2003/0086305 A1 May 8, 2003

(30) Foreign Application Priority Data

Jun. 15, 2001 (FR) .............................................. 01 07873

(51) Int. Cl.$^7$ .............................................. G11C 17/00
(52) U.S. Cl. ........................ 365/94; 365/103; 365/104
(58) Field of Search ........................ 365/94, 103, 104, 365/168, 189.01, 63

(56) References Cited

U.S. PATENT DOCUMENTS

| | | | |
|---|---|---|---|
| 4,630,240 A | * 12/1986 | Poteet et al. | ........... 365/189.05 |
| 4,809,227 A | 2/1989 | Suzuki et al. | ............... 365/168 |
| 5,177,743 A | * 1/1993 | Shinoda et al. | ............. 714/702 |
| 5,528,534 A | 6/1996 | Shoji | .......................... 365/104 |
| 5,831,892 A | 11/1998 | Thewes et al. | ................ 365/94 |
| 5,870,326 A | 2/1999 | Schuelein | ..................... 365/94 |
| 6,002,607 A | * 12/1999 | Dvir | ............................ 365/103 |
| 6,292,408 B1 | * 9/2001 | Kawashima et al. | ... 365/189.11 |

FOREIGN PATENT DOCUMENTS

EP  1059669  12/2000

* cited by examiner

Primary Examiner—David Nelms
Assistant Examiner—Gene N. Auduong
(74) Attorney, Agent, or Firm—Duane Morris LLP

(57) ABSTRACT

A ROM including a set of memory points arranged in rows and columns, in which each memory point, formed of a single controllable switch, memorizes an N-bit information, with N>=2. Each column includes 2N conductive lines; each of the two main terminals of each memory point is connected to one of said conductive lines, each information value being associated with a specific assembly of $2^N$ connections from among the set of $2^{2N}$ possible connections; and each of N read means is provided to apply a precharge voltage to a chosen group of $2^{N-1}$ first lines, connect the $2^{N-1}$ other lines to a reference voltage, select a memory point, read the voltages from the first lines, combine the obtained results to provide an indication of the value of one of the bits of the information contained in the selected memory point.

4 Claims, 2 Drawing Sheets

MULTIBIT MEMORY POINT MEMORY

BACKGROUND OF THE INVENTION

1. Field of the Invention

The present invention relates to the field of memories and more specifically of ROMs.

2. Discussion of the Related Art

Conventionally, in a ROM, storage elements or memory points are arranged at the intersection of rows and columns, each memory point being likely to memorize a binary state, that is, a 0 or a 1. Thus, each memory point is a single-bit point.

To reduce the size of memories, it has been provided that each memory point, instead of being able to be in one or the other of two states, is likely to provide a richer information, characteristic for example of one or the other of three or four states. Preferably, for memory management reasons, it would be preferred for each memory point to be able to memorize an integral number of bits, that is, a number of data equal to an integral power of 2. Each memory point would for example correspond to a transistor, the conduction level of which would be greater or smaller when controlled to be in the on state. For this purpose, it may be envisaged to provide, at the level of each memory point, transistors of larger or smaller size, or again to provide transistors with a floating gate, the gate of which is more or less precharged. However, none of these solutions has been crowned with industrial success in standard CMOS technology, most likely because all these solutions imply relatively complex technological operations and require comparing a voltage or current level with several distinct thresholds. This operation is always relatively complex and risks suffering from a lack of reliability if the component characteristics drift.

SUMMARY OF THE INVENTION

Thus, an object of the present invention is to enable storage in a simple memory point of several data, that is, an information of several bits, or multibit information.

Another object of the present invention is to provide an array of such memory points in which the memory points are all identical.

Another object of the present invention is to provide such a memory point array in which the read operations are binary and reliable.

Another object of the present invention is to provide such a memory point array which is particularly easy to form and which takes up little room on an integrated circuit.

To achieve these objects, the present invention provides a ROM including a set of memory points arranged in rows and columns, in which each memory point, formed of a single controllable switch, memorizes an N-bit information, with N>=2. Each column includes 2N conductive lines; each of the two main terminals of each memory point is connected to one of said conductive lines, each information value being associated with a specific assembly of $2^N$ connections from among the set of $2^{2N}$ possible connections; and each of N read means is provided to apply a precharge voltage to a chosen group of $2^N$ first lines, connect the $2^N$ other lines to a reference voltage, select a memory point, read the voltages from the first lines, combine the obtained results to provide an indication of the value of one of the bits of the information contained in the selected memory point.

According to an embodiment of the present invention, each switch is a MOS transistor, two adjacent transistors of a same column having a common source/drain region.

According to an embodiment of the present invention, the gates of the MOS transistors of a same row are interconnected.

The foregoing objects, features and advantages of the present invention, will be discussed in detail in the following non-limiting description of specific embodiments in connection with the accompanying drawings.

DETAILED DESCRIPTION

One of the bases of the present invention has been for the inventor to consider and classify the various types of existing memory cells to search whether one of the cells could be transformed into a multibit cell.

The most current memory cells are cells in which, at a crossing point, a memorized information materializes as the presence or the absence of a transistor, or more generally as the presence of an active or inactive transistor. An active transistor is a transistor which turns on when a signal is applied to its control terminal, generally, its gate, since memories are generally designed based on MOS transistors. An inactive transistor is a transistor which remains off while the signal applied on its gate is enough to turn on a corresponding active transistor. Such an inactive transistor is generally made like an active transistor, by skipping or adding one or several manufacturing steps so that it is not functional. It can be said that such conventional memories are memories with a coding by the presence or the absence of a transistor.

Figure 1:
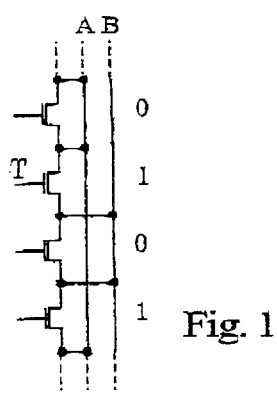
FIG. 1 shows a column of memory points of the connection position coding type.

A second type of memory point has been described in U.S. Pat. No. 5,917,224 of L. Zangara, sold to the applicant. The architecture of a memory point column of this second type is shown in FIG. 1. This column includes a chain of transistors T, two adjacent transistors having confounded source-drain regions. To each column are associated two lines A and B between which, in the reading, it is attempted to determine whether there is or not a conduction. Generally, one of these lines is assigned to a reference voltage, the other line is precharged, and, after the end of the precharge, the potential difference between the two lines is read while one of memory points T is addressed All the memory points are identical active transistors but each transistor has its main terminals connected either to the same line or to two different lines. If both terminals are connected to the same line and this transistor is addressed, the precharged line will remain at the precharge voltage, which characterizes a first state. If the two terminals of the addressed transistor are connected to different lines, this transistor short-circuits the two lines and the voltage of the precharged line drops, which characterizes a second state. It can be said that this second type of memory is a connection position coding memory.

The present invention provides a modification of this second type of memory to make it a multibit memory. The present invention will first be described in the case where a memory point enables storing a three-bit information, which will result in a generalization of the present invention.

Two-bit Memory Point

Figure 2:
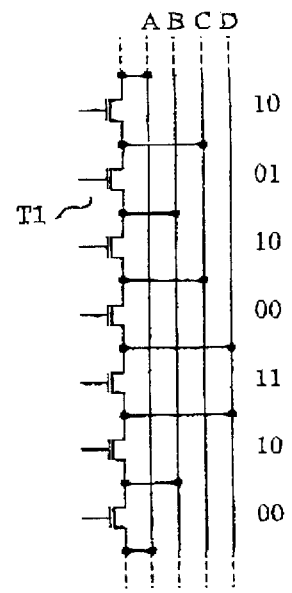
FIG. 2 shows an embodiment of a two-bit memory point column according to the present invention.
Figure 3A:
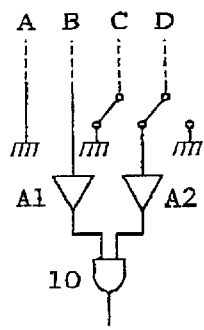
FIGS. 3A and 3B show read circuits adapted to the memory column of FIG. 2.
Figure 3B:
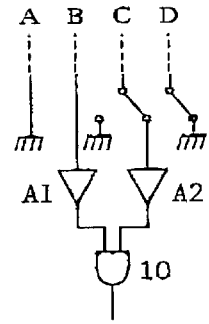

FIG. 2 illustrates an embodiment of a two-bit memory point memory according to an embodiment of the present invention. Each column of the memory includes a chain of transistors T1 associated with four ($2^2$) lines A, B, C, D. Each column is associated with a read circuit such as illustrated in FIGS. 3A and 3B. For two adjacent transistors of a same column, the drain of one transistor corresponds to the source of the other. Each transistor has its drain connected to one of lines A, B, C, D and its source connected to one of lines A, B, C, D (possibly the same line). All transistors are identical and are active transistors In read mode, one of the column transistors is selected and the read circuit is successively placed in the configuration illustrated in FIG. 3A, then in the configuration illustrated in FIG. 3B. This switching from one configuration to the other may be performed by any known switching means. Read circuits associated with storage means could also be simultaneously used.

In the configuration of FIG. 3A, two of the lines, A and C, are connected to a reference voltage, which will be called the ground for simplification, but which must only be different from a precharge voltage mentioned hereafter. The other two lines, B and D, are likely to be precharged, then connected to an AND gate 10, via respective read amplifiers A1 and A2. Thus, if the column transistor that receives a control signal has its terminals connected to the same line, to line B and to line D or to line A and to line C, this transistor will connect none of lines B and D to ground. These lines will remain at the precharge voltage, both amplifiers A1 and A2 will provide a signal in the high state (1), and the AND gate 10 will output a 1. However, if the considered transistor connects line B or line D to line A or to line C, a 0 will be detected. This corresponds to the reading of a first bit of the considered memory point.

In a second read phase, to read the second bit, the modified read circuit as shown in FIG. 3B, in which lines A and D are grounded, and lines B and C are likely to be precharged, then "read", may be used. It the considered transistor T1 has its main terminals connected to the same line, to lines A and D or to lines B and C, lines B and C will not be discharged. However, if the considered transistor has one of its terminals connected to line B or C and the other one of its terminals connected to line A or D, line B or C will discharge. In the first case, a 1 will be detected at the output of AND gate 10, and in the second case, a 0 will be detected.

Based on these considerations, and considering the specific read circuits illustrated in FIGS. 3A and 3B, it can be seen that for each memory point, data 00, 01, 10, and 11 may be coded in one of the four ways indicated in the following table 1.

TABLE 1

| Data | Drain/source connections of the MOS transistor | | | |
|------|------|------|------|------|
| 00 | AB | BA | CD | DC |
| 01 | AD | BC | CB | DA |

TABLE 1-continued

| Data | Drain/source connections of the MOS transistor | | | |
|------|------|------|------|------|
| 10 | AC | BD | CA | DB |
| 11 | AA | BB | CC | DD |

For the completeness of the table, it has for example been indicated that datum 00 could be created by connection AB or BA and by connection CD or DC. These are in fact symmetrical connections.

It should be noted, comparing this table with the read circuits of FIGS. 3A and 3B, that these circuits effectively decode the indicated two-bit data for the indicated connections. As an example, the coding corresponding to each of the column transistors, successively 10, 01, 10, 00, 11, 10 and 00 for the read mode illustrated in FIGS. 3A and 3B, has been indicated in FIG. 2.

Generally, from the time that a mode for reading the two bits has been chosen, by assigning a reference line (here, line A) then by first "reading" two of lines B, C, D (here, lines B and D), then reading two other lines out of B, C, D (here, lines B and C), a transistor coding table can be constructed. It is important that, for each transistor, a connection to any one of the lines and to another chosen line can be provided to perform any chosen coding given that two adjacent transistors have a common terminal and thus that, once a transistor has been programmed, the connection of one of the terminals of the immediately adjacent transistor is predetermined.

Figure 4:
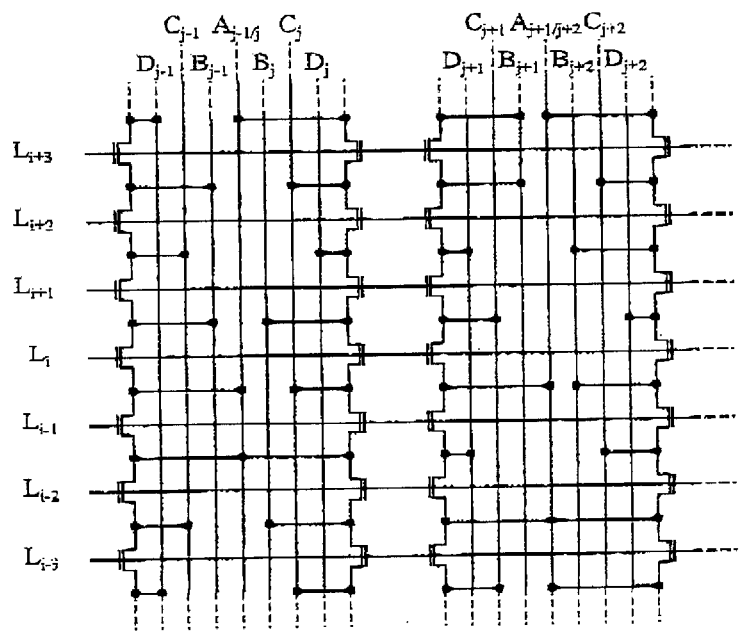
FIG. 4 shows an embodiment of a set of two-bit memory point columns according to the present invention.

Since one of lines A, B, C and D, here line A, always is at the reference voltage, two adjacent columns can share a common line. This is shown in FIG. 4 in which seven successive rows i+3 to i−3 and four successive columns j−1 to j+2 have been illustrated. Column j−1 includes four lines $D_{j-1}$, $C_{j-1}$, $B_{j-1}$, and $A_{j-1}$ and column j includes four successive lines $A_j$, $B_j$, $C_j$, and $D_j$. Lines $A_{j-1}$ and $A_j$ form one and the same line. Similarly, for columns j+1 and j+2, line $A_{j+1}$ and line $A_{j+2}$ are one.

Various alterations and modifications will occur to those skilled in the art. Each memory point has been illustrated in the drawing as being a MOS transistor. Generally, it may be any structure forming a controllable switch and the various types of controllable switches known in the art may be used.

An important advantage of the present invention is the fact that each memorized bit couple is detected by two successive binary state read operations. Upon each reading, a high or low level is detected, rather than various intermediary levels.

Three-bit Memory Point

Figure 5:
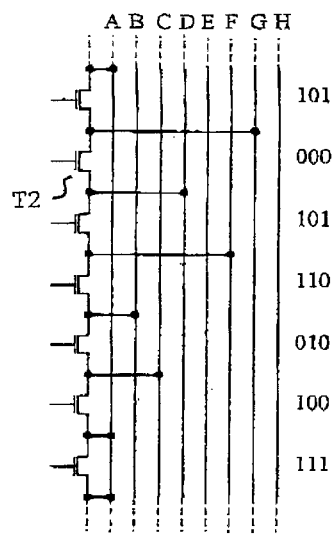
FIG. 5 shows an embodiment of a three-bit memory point column according to the present invention.

FIG. 5 illustrates a column of a memory according to the present invention in which each memory point is likely to memorize three data bits. Each column includes a chain of transistors T2 associated with eight ($2^3$) lines A, B, C, D, E, F, G, H. Each transistor has its drain connected to one of lines A, B, C, D, E, F, G, H and its source connected to one of lines A, B, C, D, E, F, G, H (possibly the same).

Figure 6A:
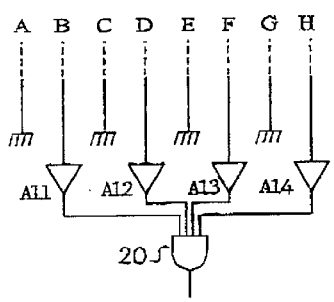
FIGS. 6A, 6B and 6C show read circuits adapted to the memory column of FIG. 5.
Figure 6B:
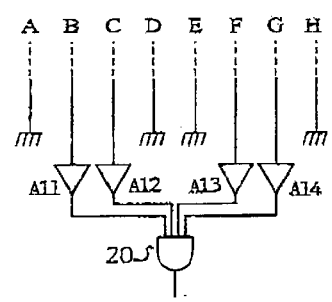
Figure 6C:
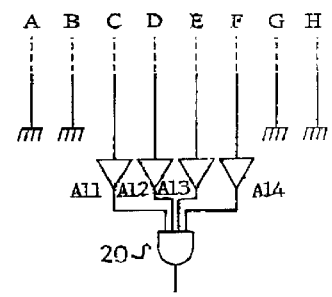

The reading of such a memory point is performed by successively using read circuits such as illustrated in FIGS. 6A, 6B, and 6C. In each read circuit, four lines are grounded and four lines are prechargeable and connected to read amplifiers A11, A12, A13, and A14 having their outputs connected to an AND gate 20. The read circuits can be distinguished in that in each circuit, four lines different from those of the preceding circuit are connected to the read amplifiers. In practice, this can be achieved by appropriate switching circuits. These read circuits are successively used to read the first, second, and third bits memorized in each memory point. It should be understood, by analogy with the two-bit circuit, that:

for the circuit for reading the first bit shown in FIG. 6A, the output will be at 1 if the terminals of the considered memory point are connected between lines A, C, E and G or between lines B, D, F et H or to the same line; and the output will be at 0 if the connections of the involved memory point are arranged between any one of lines B, D, F and H and any one of lines A, C, E and G;

for the circuit for reading the second bit shown in FIG. 6B, the output will be at 1 if the considered memory point has its terminals connected between one of lines A, D, E, or H or between one of lines B, C, F or G or to two lines or to the same line; and the output will be at 0 if the connections of the involved memory point are arranged between any one of lines B, C, F, and G and any one of lines A, D, E and H; and for the circuit for reading the third bit shown in FIG. 6C, the output will be at 1 if the memory point has its terminals connected between lines A, B, G or H or between lines C, D, E or F or to the same line; and the output will be at 0 if the memory point is connected between one of lines C, D, E, F and one of lines A, B, G or H.

This corresponds to the following table 2.

TABLE 2

| Data | Drain/source connections of the MOS transistor | | | | | | | |
|---|---|---|---|---|---|---|---|---|
| 000 | AF | BE | CH | DG | EB | FA | GD | HC |
| 001 | AB | BA | CD | DC | EF | FE | GH | HG |
| 010 | AD | BC | CB | DA | EH | FG | GF | HE |
| 011 | AH | BG | CF | DE | ED | FC | GB | HA |
| 100 | AC | BD | CA | DB | EG | FH | GE | HF |
| 101 | AG | BH | CE | DF | EC | FD | GA | HB |
| 110 | AE | BF | CG | DH | EA | FB | GC | HD |
| 111 | AA | BB | CC | DD | EE | FF | GG | HH |

Figure 7:
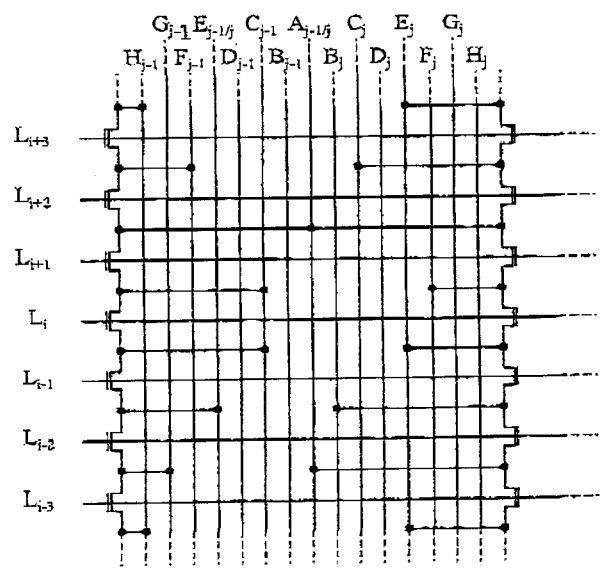
FIG. 7 shows an embodiment of a set of three-bit memory columns according to the present invention.

It should be noted that, in the read circuits of the three-bit cell, as for the two-bit cell, a line (line A) is constantly grounded. This line may be common to two neighboring cell columns. This is shown in FIG. 7 where it can be seen that among lines A to H of columns j−1 and j, lines $A_j$ and $A_{j-1}$ form one and the same line.

Multi-bit Memory Point

What has been described previously generalizes to N-bit memory points. For this purpose, each column will include $2^N$ lines and the memory points will have their terminals connected to one of these $2^N$ lines. N read circuits will be provided, selectively connected to $2^{N-1}$ different lines among the $2^N$ lines. Based on these connections, those skilled in the art will readily determine a coding table corresponding to above tables 1 and 2.

The present invention is likely to have various alterations, modifications, and improvement which will readily occur to those skilled in the art. Especially, according to the choices made for the read cell connections, a corresponding table enabling identification of N bits per memory point associated with $2^N$ lines may each time be deduced.

In a practical embodiment, those skilled in the art will be able to manufacture the illustrated circuit in various manners, for example, by providing the various lines forming each column in various metallization levels and by providing connections (vias) between the various metallization levels. Each transistor has been indicated to be connected to a column formed of several lines. Terms "column" and "row" are interchangeable, "column" not necessarily implying that the corresponding lines are vertical.

Although each memory point has been described as being a MOS transistor with its drain or source region common to the source or drain region of the adjacent MOS transistor of the same column, any switchable switch may be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A ROM including a set of memory points arranged in rows and columns, in which each memory point, formed of a single controllable switch, memorizes an N-bit information, with N>=2, wherein:

each column includes $2^N$ conductive lines;

each of the two main terminals of each memory point is connected to one of said conductive lines, each information value being associated with a specific assembly of $2^N$ connections from among the set of the $2^{2N}$ possible connections; and each of N read means is provided to apply a precharge voltage to a chosen group of $2^{N-1}$ first lines, connect the $2^{N-1}$ other lines to a reference voltage, select a memory point, reading the voltages from the first lines, combine the obtained results to provide an indication of the value of one of the bits of the information contained in the selected memory point.

2. The ROM of claim 1, wherein each switch is a MOS transistor, two adjacent transistors of a same column having a common source/drain region.

3. The ROM of claim 2, wherein the gates of the MOS transistors of a same row are interconnected.

4. The ROM of claim 1, wherein each memory point is likely to memorize two bits, in which each column includes four lines respectively called A, B, C, D and in which, for the reading of the first bit, lines A and C are grounded and lines B and D are connected to precharge and read circuits and, for the reading of the second bit, lines A and D are grounded and lines B and C are connected to precharge and read circuits, the connections of the transistors for each of the possible two-bit binary data being given by the following table:

| Data | Drain/source connections of the MOS transistor | | | |
|---|---|---|---|---|
| 00 | AB | BA | CD | DC |
| 01 | AD | BC | CB | DA |
| 10 | AC | BD | CA | DB |
| 11 | AA | BB | CC | DD |

* * * * *